United States Patent
Fan et al.

(10) Patent No.: US 10,347,559 B2
(45) Date of Patent: Jul. 9, 2019

(54) HIGH THERMAL CONDUCTIVITY/LOW COEFFICIENT OF THERMAL EXPANSION COMPOSITES

(75) Inventors: Wei Fan, Strongsville, OH (US); Xiang Liu, Medina, OH (US); John Mariner, Avon Lake, OH (US)

(73) Assignee: MOMENTIVE PERFORMANCE MATERIALS INC., Waterford, NY (US)

( * ) Notice: Subject to any disclaimer, the term of this patent is extended or adjusted under 35 U.S.C. 154(b) by 846 days.

(21) Appl. No.: 13/049,498

(22) Filed: Mar. 16, 2011

(65) Prior Publication Data

US 2012/0234524 A1 Sep. 20, 2012

(51) Int. Cl.
  *B32B 9/00* (2006.01)
  *H01L 23/373* (2006.01)
  *H01L 23/36* (2006.01)

(52) U.S. Cl.
  CPC ............ *H01L 23/373* (2013.01); *B32B 9/007* (2013.01); *B32B 2250/03* (2013.01); *B32B 2250/40* (2013.01); *B32B 2307/30* (2013.01); *B32B 2307/302* (2013.01); *B32B 2307/304* (2013.01); *B32B 2307/546* (2013.01); *B32B 2457/00* (2013.01); *H01L 23/36* (2013.01); *H01L 2924/0002* (2013.01); *Y10T 428/31678* (2015.04)

(58) Field of Classification Search
  CPC ................................. C01B 32/00; C01B 31/04
  USPC ............................ 428/408; 423/448; 165/185
  See application file for complete search history.

(56) References Cited

U.S. PATENT DOCUMENTS

| | | | |
|---|---|---|---|
| 3,404,061 | A | 10/1968 | Shane et al. |
| 4,961,994 | A | 10/1990 | Cariou et al. |
| 5,149,518 | A | 9/1992 | Mercuri et al. |
| 5,195,021 | A | 3/1993 | Ozmat et al. |
| 5,296,310 | A | 3/1994 | Kibler et al. |
| 5,305,947 | A | 4/1994 | Osada et al. |
| 5,437,328 | A | 8/1995 | Simons |

(Continued)

FOREIGN PATENT DOCUMENTS

| | | |
|---|---|---|
| CN | 1666079 | 9/2005 |
| CN | 101048055 | 10/2007 |

(Continued)

OTHER PUBLICATIONS

Santier—Materials Spec. Sheet, www.santier.com/images/Revised Materials Spec Shett 06.23.14.pdf.

(Continued)

*Primary Examiner* — Daniel H Miller
(74) *Attorney, Agent, or Firm* — Joseph Waters; McDonald Hopkins LLC

(57) ABSTRACT

A high thermal conductivity/low coefficient of thermal expansion thermally conductive composite material for heat sinks and an electronic apparatus comprising a heat sink formed from such composites. The thermally conductive composite comprises a high thermal conductivity layer disposed between two substrates having a low coefficient of thermal expansion. The substrates have a low coefficient of thermal expansion and a relatively high modulus of elasticity, and the composite exhibits high thermal conductivity and low coefficient of thermal expansion even for composites with high loadings of the thermally conductive material.

21 Claims, 5 Drawing Sheets

(56) References Cited

U.S. PATENT DOCUMENTS

| | | | |
|---|---|---|---|
| 5,509,993 | A | 4/1996 | Hirschvogel |
| 5,889,220 | A | 3/1999 | Akiyoshi et al. |
| 5,958,572 | A | 9/1999 | Schmidt et al. |
| 5,998,733 | A | 12/1999 | Smith |
| 6,009,937 | A | 1/2000 | Gonner et al. |
| 6,057,701 | A | 5/2000 | Kolev |
| 6,075,701 | A * | 6/2000 | Ali et al. ................ 361/704 |
| 6,131,651 | A * | 10/2000 | Richey, III ............... 165/185 |
| 6,245,400 | B1 | 6/2001 | Tzeng et al. |
| 6,407,922 | B1 | 6/2002 | Eckblad et al. |
| 6,432,536 | B1 | 8/2002 | Hecht et al. |
| 6,475,429 | B2 | 11/2002 | Osada et al. |
| 6,503,626 | B1 | 1/2003 | Norley et al. |
| 6,538,892 | B2 | 3/2003 | Smalc |
| 6,749,010 | B2 | 6/2004 | Getz, Jr. et al. |
| 6,758,263 | B2 | 7/2004 | Krassowski et al. |
| 6,771,502 | B2 | 8/2004 | Getz, Jr. et al. |
| 6,777,086 | B2 | 8/2004 | Norley et al. |
| 6,841,250 | B2 | 1/2005 | Tzeng |
| 6,862,183 | B2 | 3/2005 | Chrysler et al. |
| 6,907,917 | B2 | 6/2005 | Chu et al. |
| 6,918,438 | B2 | 7/2005 | Ellsworth, Jr. et al. |
| 7,157,517 | B2 | 1/2007 | Gulari et al. |
| 7,166,912 | B2 | 1/2007 | Tzeng et al. |
| 7,220,485 | B2 | 5/2007 | Sayir et al. |
| 7,222,423 | B2 | 5/2007 | Ellsworth, Jr. et al. |
| 7,254,888 | B2 | 8/2007 | Chu et al. |
| 7,297,399 | B2 | 11/2007 | Zhang et al. |
| 7,303,005 | B2 | 12/2007 | Reis et al. |
| 7,306,847 | B2 | 12/2007 | Capp et al. |
| 7,365,988 | B2 | 4/2008 | Reis et al. |
| 7,393,587 | B2 | 7/2008 | Krassowski et al. |
| 7,402,340 | B2 | 7/2008 | Ozaki et al. |
| 7,573,717 | B2 | 8/2009 | Reis et al. |
| 7,602,051 | B2 | 10/2009 | Ito et al. |
| 7,616,441 | B2 | 11/2009 | Horng |
| 7,744,991 | B2 | 6/2010 | Fischer et al. |
| 7,799,428 | B2 * | 9/2010 | Fujiwara et al. ........... 428/408 |
| 7,880,121 | B2 | 2/2011 | Naylor |
| 2002/0163076 | A1 | 11/2002 | Tzeng et al. |
| 2003/0116312 | A1 | 6/2003 | Krassowski et al. |
| 2004/0001317 | A1 | 1/2004 | Getz, Jr. et al. |
| 2006/0266496 | A1 | 11/2006 | Edward et al. |
| 2007/0030653 | A1 | 2/2007 | Norley et al. |
| 2007/0053168 | A1 | 3/2007 | Sayir et al. |
| 2007/0103875 | A1 | 5/2007 | Reis et al. |
| 2007/0159799 | A1 | 7/2007 | Dando, III et al. |
| 2007/0204972 | A1 | 9/2007 | Edward et al. |
| 2007/0231560 | A1 | 10/2007 | Zhang et al. |
| 2008/0149322 | A1 | 6/2008 | Ottinger et al. |
| 2008/0213219 | A1 | 9/2008 | Zeldis |
| 2009/0232991 | A1 * | 9/2009 | Wang .................. H01L 23/373 427/294 |
| 2010/0326645 | A1 | 12/2010 | Fan et al. |
| 2011/0070459 | A1 * | 3/2011 | Kim ............... 428/615 |

FOREIGN PATENT DOCUMENTS

| | | |
|---|---|---|
| CN | 103547441 | 1/2014 |
| EP | 0432944 | 6/1991 |
| EP | 2686163 | 1/2014 |
| JP | H04-250641 A | 9/1992 |
| JP | H02-094649 A | 4/1994 |
| JP | H07-109171 A | 4/1994 |
| JP | 2002050725 | 2/2002 |
| JP | 2003168882 | 6/2003 |
| JP | 2007-109880 A | 4/2007 |
| JP | 2011-023670 A | 2/2011 |
| KR | 1020060081304 | 7/2006 |
| WO | 9914805 | 3/1999 |
| WO | 2012/125817 | 9/2012 |

OTHER PUBLICATIONS

International Search Report and the Written Opinion of the International Searching Authority, Momentive Performance Materials, Inc., PCT/US2012/029215, dated Jul. 13, 2012.

Smalc et al., Thermal Performance of Natural Graphite Heat Spreaders, Proceedings of IPACK2005, ASME InterPACK '05, Jul. 2005, pp. 1-11.

International Preliminary Report on Patentability, Momentive Performance Materials, Inc., PCT/US2012/029215, dated Sep. 17, 2013.

Applied Technology, Thermal Core Material Cools High-Power PCBs, May 1997.

Chinese Office Action for Chinese Patent Application No. 201280013459.4 dated Aug. 28, 2014.

Chinese Office Action for Chinese Patent Application No. 201280013459.4 dated Apr. 14, 2015.

Extended European Search Report for European Application No. 12 75 7194, dated Mar. 27, 2015.

Japan Patent Office (JPO), Notification of Reasons for Rejection for Patent Application No. 2013-558171, drafted Mar. 17, 2016, dated Mar. 22, 2016, Fourth Patent Examination Department, Japan.

* cited by examiner

HIGH THERMAL CONDUCTIVITY/LOW COEFFICIENT OF THERMAL EXPANSION COMPOSITES

The disclosed technology relates to a thermal management assembly including, but not limited to a heat transfer device, which may also be referred to as a heat spreader, that can be used for transferring heat away from a heat source, e.g., to a heat sink; an assembly having the heat spreader in contact with the heat source, e.g., between the heat source and the heat sink; and a heat sink for dissipating the heat. The invention also relates to methods of manufacturing a thermal management assembly.

BACKGROUND

Many forms of thermal management exist today all of which depend upon the principles of conduction, convection, or radiation to move heat. Good thermal conductivity is required to permit heat transfer away from high density electronic components and devices such as integrated circuits. High thermal conductivity materials are conventionally used in heat transfer devices to dissipate heat from semiconductor circuits and systems. Heat transfer devices with high thermal conductivity materials may also be utilized in aerospace and military applications. Elemental metals are not satisfactory for the semiconductor circuit systems in use today. This has led to the use of high conductivity heat transfer devices formed from composites or laminations of different materials fabricated into various structural assemblies which will possess the desired high thermal conductivity, strength, and other needed properties.

A heat sink is a thermal dissipation device comprised of a mass of material that is internally coupled to a heat source to conduct thermal energy away from the heat source. Heat sinks are typically designed to transport the heat from the heat spreader on the integrated circuit to ambient air. The heat sink may be in the form of fins or integrated heat spreader. The heat sink conducts the thermal energy away from a high-temperature region (e.g., the processor) to a low-temperature region (e.g., the heat sink). Thermal energy is then dissipated by convection and radiation from the surface of the heat sink into the atmosphere surrounding the heat sink. Heat sinks are typically designed to increase the heat transfer efficiency by primarily increasing the surface area that is in direct contact with the air or liquid. This allows more heat to be dissipated and thereby lowers the device operating temperature.

Heat sinks used for cooling electronic components typically include a thermally conductive base plate that interfaces directly with the device to be cooled and a set of plate or pin fins extending from the base plate. The fins increase the surface area that is in direct contact with the air or liquid, and thereby increase the heat transfer efficiency between the heat source and ambient.

In conventional heat sinks, the base and/or the fins are typically either copper or aluminum. Copper and aluminum have relatively high coefficients of thermal expansion (CTE). Electronic components, including semi-conductor materials in those components, are typically formed from a material having a low CTE ($4 \sim 7 \times 10^{-6}/°$ C.). While copper and aluminum exhibit good thermal conductivities, a large mismatch in terms of differences in the CTE of the heat sink material and the electronic component(s) may introduce excess stress to the mounted electronic components (e.g., semi-conductor chips), which may lead to failure or unreliable operation. Low CTE materials such as aluminum silicon carbide (AlSiC), molybdenum-copper alloys, tungsten-copper alloys, or copper-molybdenum laminates have been used for heat sinks. These materials have low thermal conductivities, and the use of these materials in heat sinks generally sacrifices thermal conductivity for better CTE matching with the electronic components.

SUMMARY

In one aspect, the present invention provides a thermally conductive composite material exhibiting low CTE and high thermal conductivity (TC). In another aspect, the present invention provides a material having low CTE and excellent thermal conductivity in both the in-plain and through-plain direction. In still another aspect, the present invention provides a composite material having a relatively low CTE, relatively high thermal conductivity and a low density. The composite materials are adapted and particularly suitable for use in a thermal management assembly, including but not limited to, e.g., heat transfer device such as a heat spreader, heat sink, and the like.

According to one aspect of the invention, a thermally conductive composite comprises a first metal substrate; a second metal substrate; and a layer of thermal pyrolytic graphite disposed between the first and second metal substrates, the first and second metal substrates bonded to the graphite layer and comprising a metal having a modulus of elasticity of about 200 GPa or greater, the composite having a in-plane coefficient of thermal expansion of about 13 ppm/° C. or less and a thermal conductivity of about 200 W/m-K or greater.

According to one embodiment, the first and second metal substrate interpedently comprises a metal chose from tungsten, molybdenum, tungsten alloys, molybdenum alloys, or combinations of two or more thereof.

According to one embodiment, the first and second metal substrate each have a coefficient of thermal expansion of about 4 to about 13 ppm/° C.

According to one embodiment, the composite comprises from about 20 to about 90% by volume of thermal pyrolytic graphite.

According to one embodiment, the composite comprises from about 40 to about 80% by volume of thermal pyrolytic graphite.

In another aspect, the composite comprises from about 55 to about 87% by volume of thermal pyrolytic graphite.

According to one embodiment, the substrates have a modulus of elasticity of about 300 GPa or greater.

According to one embodiment, the substrates have a modulus of elasticity of about 400 GPa or greater.

According to one embodiment, the composite has a coefficient of thermal expansion of about 4 to about 9 ppm/° C.

According to one embodiment, the composite has a coefficient of thermal expansion of about 4 to about 7 ppm/° C.

According to one embodiment, the thermal pyrolytic graphite comprises a plurality of layered planes, and the graphite is disposed in the composite such that the layered planes are oriented in a direction horizontal to the plane of the metal substrates.

According to one embodiment, wherein the thermal pyrolytic graphite comprises a plurality of layered planes and the graphite is disposed in the composite such that the layered planes are oriented in a direction vertical to the plane of the metal substrates.

According to another aspect of the invention, an electronic structure comprises an electronic device; and a heat sink assembly in thermal contact with the electronic device, the heat sink assembly comprising a thermally conductive composite comprising a piece of thermal pyrolytic graphite disposed between first and second metal substrates, the first and second metal substrates bonded to the graphite and comprising a metal independently having a modulus of elasticity of about 200 GPa or greater, and the composite having a coefficient of thermal expansion of about 13 ppm/° C. or less and a thermal conductivity of about 200 W/m-K or greater.

According to one embodiment of the electronic device, the first and second metal substrates interpedently comprise a metal chose from tungsten, molybdenum, tungsten alloys, molybdenum alloys, or combinations of two or more thereof.

According to one embodiment of the electronic device, the first and second metal substrate each have a modulus of elasticity of about 300 GPa or greater.

According to one embodiment of the electronic device, the composite comprises from about 20 to about 90% by volume of thermal pyrolytic graphite.

According to one embodiment of the electronic device, the composite comprises from about 40 to about 80% by volume of thermal pyrolytic graphite.

According to one embodiment of the electronic device, the thermal pyrolytic graphite comprises a plurality of layered planes and the graphite is disposed in the composite such that the layered planes are oriented in a direction vertical to the plane of the metal substrates.

In yet another aspect of the present invention, a composite sheet comprises a first metal substrate chosen from at least one of tungsten, molybdenum, tungsten-alloys, and molybdenum-alloys; a second metal substrate chosen from at least one of tungsten, molybdenum, tungsten-alloys, and molybdenum alloys; and a thermal pyrolytic graphite sheet disposed between the first and second metal substrates, the thermal pyrolytic graphite sheet comprising a plurality of layered planes, the composite sheet having a coefficient of thermal expansion of about 13 ppm/° C. or less and a thermal conductivity of about 200 W/m-K or greater.

According to one embodiment of the composite, the composite comprises from about 20 to about 90% by volume of thermal pyrolytic graphite.

According to one embodiment of the composite, the composite comprises from about 55 to about 87% by volume of thermal pyrolytic graphite.

According to one embodiment of the composite, the composite exhibits a thermal conductivity of about 300 to about 1000 W/m-K.

According to one embodiment of the composite, the composite comprises the substrates are bonded to the graphite sheet.

These and other features will be described with reference to the following description and attached drawings. In the description and drawings, particular embodiments of the invention have been disclosed in detail as being indicative of some ways in which the principles of the invention may be employed, but it is understood that the invention is not limited to such embodiments. Rather, the invention includes all changes, modifications, and equivalents coming within the spirit and terms of the claims appended hereto.

Features that are described or illustrated with respect to one embodiment may be used in the same way or in a similar way in one or more other embodiments and/or in combination with or instead of the features of the other embodiments.

DETAILED DESCRIPTION

Reference will now be made in detail to exemplary embodiments of the present invention, examples of which are illustrated in the accompanying drawings. The drawings are merely schematic representations for the purpose of illustrating aspects of the present invention and are not drawn to scale. It is to be understood that other embodiments may be utilized instructional and functional changes may be made without departing from the respective scope of the invention. As such, the following description is presented by way of illustration only and should not be construed to limit in any way the various alternatives and modifications that may be made to the illustrated embodiments and still be within the spirit and scope of the invention.

The term "heat sink" may be used interchangeably with "heat dissipater" to refer to an element which not only collects the heat but also performs the dissipating function. Those terms may be in the singular or plural form, indicating one or multiple items may be present.

As used herein the term "heat spreader" or "heat transfer laminate" may be used interchangeably to refer to a device that is in contact with the source of heat and the heat sink.

Also as used herein, the term "thermal pyrolytic graphite" ("TPG") may be used interchangeably with "highly oriented pyrolytic graphite" ("HOPG"), or "annealed pyrolytic graphite" ("APG"), or "compression annealed pyrolytic graphite" ("CAPG"), referring to graphite materials having crystallites of considerable size, the crystallites being highly aligned or oriented with respect to each other and having well ordered graphene layers or a high degree of preferred crystallite orientation, with an in-plane (a-b direction) thermal conductivity greater than about 800 W/m-K. In one embodiment, the TPG has an in-plane thermal conductivity greater than about 1,000 W/m-K, and in another embodiment greater than about 1,500 W/m-K.

The disclosed technology provides a composite material suitable for use in a thermal management assembly, e.g., a heat spreader, heat sink, or the like, where the composite has a relatively low coefficient of thermal expansion and a relatively high thermal conductivity. The disclosed technology also provides an electronic assembly comprising a thermal management assembly employing the low CTE, high TC composite materials.

Figure 1:
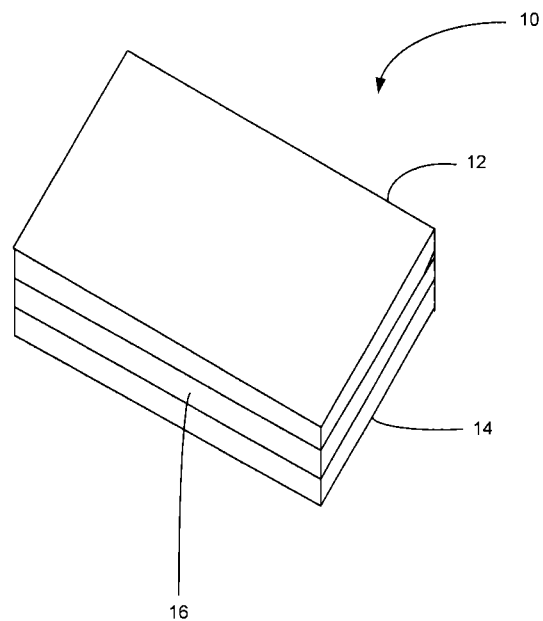
FIG. 1 is a schematic perspective representation of a thermally conductive composite having a low CTE and high thermal conductivity.

Referring to FIG. 1, a thermally conductive composite 10 is shown that comprises a first substrate 12, a second substrate 14, and a layer 16 disposed between substrates 12 and 14. The substrates 12 and 14 are formed from a material having a relatively low CTE, and the layer 16 is formed from a material having a relatively high thermal conductivity (e.g. TPG). Applicants have found that a composite with a high thermal conductivity material such as TPG sandwiched or encapsulated between low CTE metal substrates provides a composite exhibiting a relatively low CTE, and a relatively high thermal conductivity.

The substrates may be formed from a metal having a relatively high stiffness and a relatively low CTE. In one embodiment, the substrates comprise a metal having a modulus of elasticity of about 200 GPa or greater, in another embodiment about 300 GPa or greater, and in still another embodiment, about 400 GPa or greater. As is discussed further below, the inventors have found that employing metal substrates with a high modulus of elasticity and low CTE provides a composite with low CTE even in compositions where the concentration of the high thermal conductivity material is quite large.

The substrates material may have an in-plane coefficient of thermal expansion of about 13 ppm/° C. or less. In one embodiment, the substrates have a coefficient of thermal expansion of from about 4 to about 13 ppm/° C. In another embodiment, the substrates have a coefficient of thermal expansion of from about 4 to about 9 ppm/° C. In still another embodiment, the substrates have a coefficient of thermal expansion of about 4 to about 7 ppm/° C. The coefficient of thermal expansion of a substrate may be the same or different than that of the other substrate.

The metal may be chosen as desired for a particular purpose or intended use. The metal may be chosen, for example, from molybdenum, tungsten, molybdenum alloys, tungsten alloys, combinations of two or more thereof, and the like. In the composite, the respective substrates may be formed from the same or different metals (substrates may be considered to be formed from different metals where they are formed from metal alloys having the same alloy components but in different percentages). In one embodiment, the metal is chosen from a tungsten-copper alloy comprising from about 10% to about 70% copper). In another embodiment, the metal is chosen from a molybdenum-copper alloy comprising from about 10% to about 70% copper. Non-limiting, examples of suitable metals include W-10Cu (10% Cu); W-15Cu (15% Cu); Mo-30Cu (30% Cu), and the like.

The thermally conductive material 16 may be selected from any material having a high thermal conductivity including pyrolytic graphite, thermal pyrolytic graphite, annealed pyrolytic graphite, compression annealed pyrolytic graphite, highly ordered pyrolytic graphite, and the like. The in-plane thermal conductivity of the high thermal conductivity core material 16 should be greater than 200 W/m-K and desirably greater than 500 W/m-K for each of the pyrolytic graphite materials. Also as used herein, the term "thermal pyrolytic graphite" ("TPG") encompasses materials such as "highly oriented pyrolytic graphite" ("HOPG"), "annealed pyrolytic graphite" ("APG") and "compression annealed pyrolytic graphite" ("CAPG"). In one embodiment, thermal pyrolytic graphite may also refer to graphite materials consisting of crystallites of considerable size, the crystallites being highly aligned or oriented with respect to each other and having well ordered graphene layers or a high degree of preferred crystallite orientation, with an in-plane (referred to herein as the a-b or x-y direction) thermal conductivity greater than 800 W/m-K, in one embodiment greater than 1,000 W/m-K, and in still another embodiment greater than 1,500 W/m-K.

Although the generic term "graphite" may be used herein, a heat sink, depending on the application may employ either pyrolytic graphite (PG) with a typical in-plane thermal conductivity of less than 500 W/m-K, or thermal pyrolytic graphite (TPG) with an in-plane thermal conductivity greater than 600 W/m-K. In one embodiment, the starting feedstock is a graphite sheet commercially available from sources including Panasonic, Momentive Performance Materials, etc.

Graphite materials possess anisotropic structures and thus exhibit or possess many properties that are highly directional such as, for example, thermal conductivity, electrical conductivity, and fluid diffusion. Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. The superposed layers or laminate of carbon atoms in graphite are joined together by weak van der Waals forces.

It will be appreciated that the size and thickness of the thermally conductive material is not particularly limited and may be chosen as desired for a particular purpose or intended use. In one embodiment, the thermally conductive material may be provided as a graphite sheet having a thickness of from about 1 mm to about 5 mm. In another embodiment, the thermally conductive material may be provided as a "graphite layer," which refers to a single cleaving of pyrolytic or thermally pyrolytic graphite comprising at least one graphene layer of micrometer or nanometer thickness. Cleaving of graphite to obtain micrometer thick graphite layers and/or ultra-thin nanometer thicknesses is described in U.S. patent application Ser. No. 11/555,681, which is incorporated herein by reference in its entirety.

Figure 2:
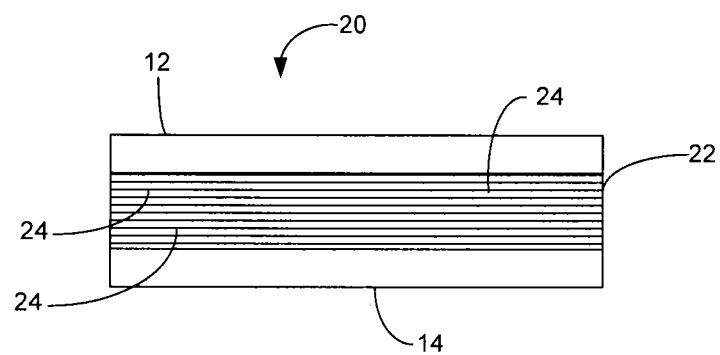
FIG. 2 is a schematic cross-sectional view of a composite in accordance with one aspect of the invention having a graphite layer with the layered planes oriented the x-y direction.

As described above, graphites and graphite sheets comprise layered planes that are ordered in the sheets such that they are substantially parallel and equal distance to one another. In the present high thermal conductivity/low CTE composites, the graphite sheet may be disposed between the metal substrates such that the layer planes are oriented substantially parallel to the plane of the metal substrates, or substantially perpendicular to the plane of the metal substrates. In one embodiment, the graphite is oriented such that the layer planes are oriented substantially parallel to the plane of the substrates (which is referred to herein as the a-b or x-y orientation, and these terms may be used interchangeably). Orienting the layer planes such that they are substantially parallel to the plane of the metal substrates provides a composite and heat transfer assembly with a thermal conductive path that is mainly in the lateral direction. Referring to FIG. 2, a composite 20 is shown comprising metal substrates 12 and 14 and a high thermal conductivity layer, e.g. a graphite sheet, 22 disposed between the metal substrates. The graphite sheet includes layer planes 24, which are oriented in a direction parallel to the plane of the metal substrates 12 and 14 (i.e., the x-y direction) (the layer planes 24 are not drawn to scale but there size is exaggerated for the purpose of illustrating their orientation in this embodiment). While exhibiting good in-plane thermal conductivity, a composite having the graphite oriented in the x-y direction may exhibit lower through-plane thermal conductivity. The low through-plane thermal conductivity may not have any significant impact on the overall performance because the short thermal path in the thickness direction is typically insignificant compared to the entire thermal path.

If improvement of the composite's through-plane conductivity is desirable for a particular application, the composite may be provided with thermal vias such as, for example, those described in U.S. application Ser. No. 12/077,412, which is incorporated by reference herein in its entirety.

Figure 3:
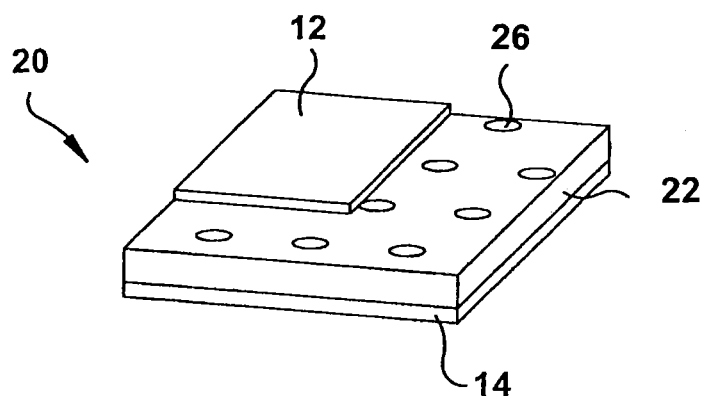
FIG. 3 is a schematic perspective view of a thermally conductive composite comprising vias in accordance with one aspect of the invention.
Figure 4:
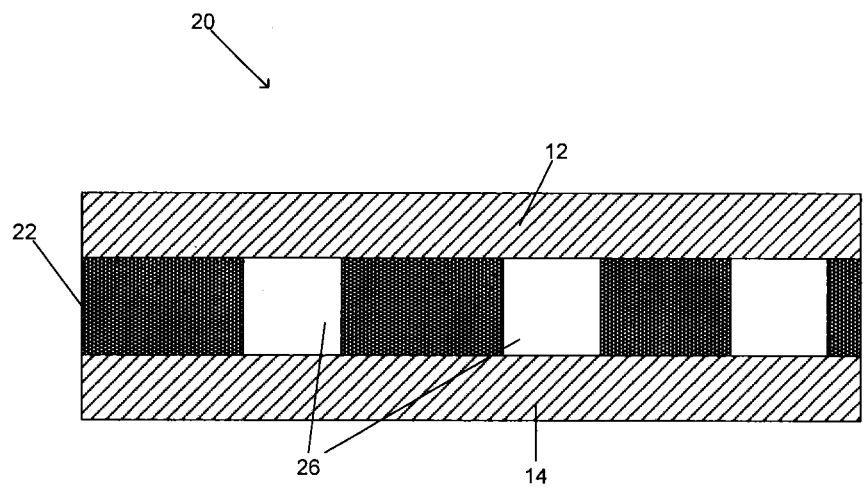
FIG. 4 is a schematic cross-sectional view of the composite of FIG. 3.

Referring to FIGS. 3 and 4, a heat transfer composite 20 comprising thermal vias is illustrated. Heat transfer composite 20 comprises a first substrate 12, a second substrate 14, and a high thermal conductivity layer 22 disposed between substrates 12 and 14. The thermally conductive layer 22 includes a plurality of vias 26.

The shape and number of vias may be selected as desired for a particular purpose or intended use. In one embodiment, the vias may occupy from about 0.1 to about 40 volume percent of the thermally conductive material. The percent volume of the thermally conductive materially that is occupied by the vias may also be referred to as the via loading density. In another embodiment, the via loading density may be from about 0.1% to about 20%. Providing a thermally conductive material having a via loading density of from about 0.1 to about 20 percent may provide a laminate that exhibits both excellent mechanical strength and thermal conductivity. For example, a laminate having a via loading density of from about 0.1 to about 20% may exhibit sufficient bonding strength (e.g., greater than 40 psi) to overcome thermal stress at 300° C., and excellent in-plane thermal conductivity (e.g., greater than 1,000 W/m-K).

Figure 5:
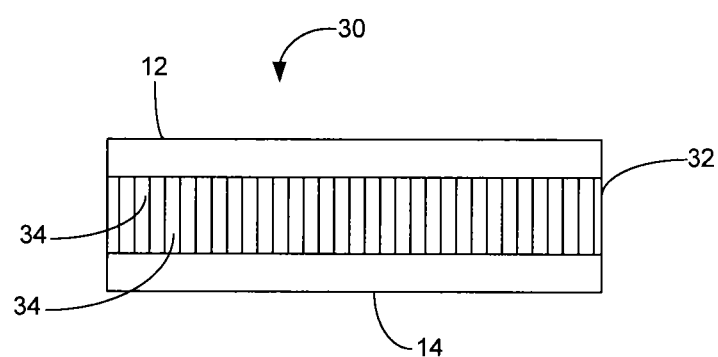
FIG. 5 is a schematic perspective view thermally conductive composite in accordance with one aspect of the present invention having a graphite layer with the layered planes oriented in the z direction.

In another embodiment, the high thermal conductivity layer is disposed between the substrates such that the layer planes are oriented substantially perpendicular to the plane of the substrates (which is referenced to herein as the "z direction"). Referring to FIG. 5, a composite 30 is shown comprising metal substrates 12 and 14 and a thermally conductive layer 32 (e.g., a graphite layer) disposed between the substrates. The thermally conductive layer 32 may comprise a graphite material comprising layer planes 34, and the graphite layer is disposed between the substrates such the layer planes 34 are oriented perpendicular to the planes of the substrates 12 and 14 (the layer planes 34 are not drawn to scale but their size is exaggerated for the purpose of illustrating their orientation in this embodiment). Configurations with the graphite layer planes oriented perpendicular to the planes of the substrates provide good through thickness conductivity and excellent spreading in one lateral direction. Thermal vias are not needed in such configurations because of the high-through plane conductivity and high tension strength in the graphite basal plane.

Applicants have found that a composite may be provided with a relatively broad range of the graphite loading (on a volume basis) and still exhibit excellent CTE and TC. In one embodiment, the thermally conductive composite comprises from about 20 to about 90% vol. of graphite. In another embodiment the thermally conductive composite comprises from about 40 to about 80% vol. of graphite. In still another embodiment, the thermally conductive composite comprises from about 55 to about 87% vol. of graphite.

Figure 7:
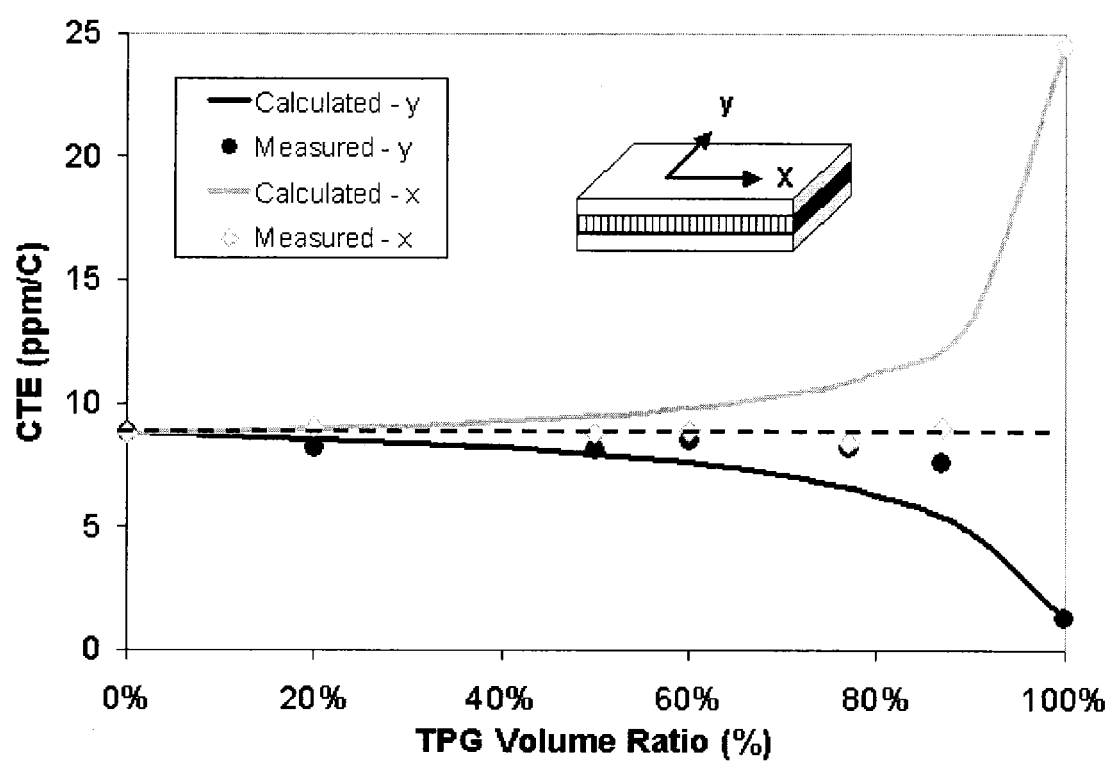
FIG. 7 is a graph illustrating the coefficient of thermal expansion of thermally conductive composites in accordance with aspects of the present invention at different graphite loadings.

With respect to composites wherein the graphite is oriented such that the layer planes are substantially perpendicular to the planes of the substrate, (i.e., the z direction), applicants have found that a composite with excellent thermal conductivity and substantially low coefficient of thermal expansion may be provided even with relatively high loadings of graphite. Due to the anisotropy of graphite coefficient of thermal expansion, the in-plane coefficient of thermal expansion for composites having the graphite oriented in the z direction can be slightly different in two directions. In particular, the coefficient of thermal expansion in the x and y directions would be expected to diverge from one another as the graphite loading in the composite increases (See, e.g., FIG. 7 showing the theoretical CTE of composite with TPG disposed between Mo-30Cu substrates). Thus, it would be expected that the higher concentration material would dominate the CTE for the composite, and higher graphite loadings would be expected to hurt the composite's CTE. Applicants have found, however, that composites having substrates with a large modulus of elasticity and the graphite oriented in the z direction exhibit coefficients of thermal expansion that are sufficiently low and substantially similar to one another in the x and y directions even at high graphite loadings (See FIG. 7).

The composite material may have a thermal conductivity of from about 200 to about 1,100 W/m-K. In one embodiment the composite material may have a thermal conductivity of from about 300 to about 1,000 W/m-K. In still another embodiment, the composite material has a thermal conductivity of from about 600 to about 900 W/m-K. The composite material may have a coefficient of thermal expansion of about 13 ppm/° C. or less. In one embodiment, the composite material has a coefficient of thermal expansion from about 4 to about 13 ppm/° C. In another embodiment, the composite material has a coefficient of thermal expansion of from about 4 to about 9 ppm/° C. In still another embodiment, the substrates have a coefficient of thermal expansion of about 4 to about 7 ppm/° C.

Additionally, by being able to provide a high thermal conductivity/low coefficient of thermal expansion composite with larger loadings of thermal pyrolytic graphite, composites of relatively low density may be provided with light TPG material (density<3 gm/cm$^3$). In one embodiment, the composite may have a density of from about 3 to about 8 gm/cm$^3$.

In one embodiment, the substrates are bonded to the high thermal conductivity layer. In one aspect, the substrates are bonded to the high thermal conductivity layer such there is substantially no slippage at the substrate/high thermal conductivity layer interface.

The composites may be formed by any suitable method for attaching the substrates to the thermally conductive material. In one embodiment, the laminate may be formed by providing the metal substrates and laminating them to opposing surfaces of the thermally conductive material. The substrates may be positioned adjacent to the respective surfaces of the thermally conductive material, and the structure is passed through rollers to laminate the substrates to the respective surfaces of the thermally conductive material. A bonding material may be provided on the surfaces of the thermally conductive material to bond the substrates to the thermally conductive material. The bonding material may be provided in discrete areas on the surface of the thermally conductive material or may be applied generally to an entire surface. In one embodiment employing vias, the bonding material is at least provided in the vicinity of the vias such that a quantity of bonding material substantially fills the via during the bonding process. It will be appreciated that a curing or activation operation may be required to set or cure the bonding material. In one embodiment employing a thermally conductive epoxy, braze, solder, or other similar material, a heating step may then be performed to activate the bonding material applied to the TPG board surface. The cured laminate may then be trimmed to its desired final dimension. In another embodiment, the thermally conductive epoxy, braze, solder, or other similar material is applied to the joining surfaces at the activation temperature before the metal substrates and thermally conductive TPG is joined together. In another embodiment, no bonding material is applied and the TPG-metal bonding is formed under high temperature and high pressure via diffusion bonding.

Bonding the substrates to the high thermal conductivity layer (e.g., a graphite layer) provides a composite with improved performance in terms of both thermal conductivity and coefficient of thermal expansion. Applicants have found that bonding low CTE substrates such as molybdenum, tungsten, molybdenum alloys, tungsten alloys, and the like, to a high thermal conductivity layer provides a composite with excellent thermal conductivity and a low coefficient of thermal expansion. Applicants have found that providing good mechanical bonding at the metal/high thermal conductivity layer interface provides a composite with low thermal interface resistance, higher through-plane thermal conductivity, and allows for the CTE of the composite to remain low and close to that of the metal substrates. Applicants have found that sliding at the substrate/graphite interface may adversely affect the thermal properties of the composite in terms of both thermal conductivity and thermal expansion.

The metal substrates may be provided in any suitable form or thickness to suit a particular purpose or intended use. In one embodiment, the metal substrates may be provided as metal foils. In one embodiment, the thickness of the substrates may be from about 0.001 to about 2 mm.

In an embodiment employing vias, holes or vias are predrilled into TPG boards at a desired size and spacing to produce optimized results. Thermally conductive epoxy, braze, solder, or any other similar material may be applied to the TPG board surface and may be used to fill the via holes either partially or completely. The loading density of the vias may range from less than 0.01% area of occupation to approximately 40% area of occupation. In another embodiment the via loading density may be from about 0.1% to about 20%. In one embodiment, the spacing of the vias may range from about 0.5 to about 125 mm to reach optimal desired results. In another embodiment, the spacing of the vias may range from about 1 to about 25 mm. The TPG board may then be laminated between at least two metal substrates. In one embodiment and prior to coating, holes or vias with sizes between 0.1 to 5 mm in diameter and spacing between 1 to 25 mm apart are drilled through the thin graphite layer using methods known in the art including Electro Discharge Machining (EDM), Electro Discharge Grinding (EDG), laser, and plasma. In another embodiment, slits are fabricated in the thin graphite strip prior to treatments.

In yet another embodiment, louvers, slits or vias are formed or perforated in the graphite layer by any of EDM, EDG, laser, plasma, or other methods known in the art. In one embodiment, the vias may be anywhere from 0.1-5 mm in diameter and placed between 1-25 mm apart to optimize thermal and mechanical performance.

The vias may be filled with a material to provide the laminate with structural support. The vias may be filled with a bonding material such as an adhesive material, a soldering metal or metal alloy, or a brazing metal or metal alloy. Suitable adhesive materials include, for example, inorganic and organic adhesives. An exemplary adhesive material is an epoxy. In one embodiment, the bonding material exhibits thermal conductivity properties, e.g., a thermally conductive epoxy.

In one embodiment foil tapes of molybdenum, tungsten, molybdenum-copper alloys, tungsten-copper alloys, or the like, backed with a highly conductive pressure-sensitive adhesive are pressed against a pyrolytic graphite substrate and peeled of, for a cleaving of pyrolytic graphite comprising at least one graphene film or layer. In one embodiment, the metal foil has a thickness of about 5.0 to about 25 μm thick, backed with carbon or Parylene, then a layer of highly conductive pressure sensitive adhesives. Metal foil tapes are commercially available from sources including Chomerics and Lebow Company.

In another embodiment, the substrates may be provided by a coating process such as chemical vapor deposition, physical vapor deposition, plasma vapor deposition, electroplating, electroless plating, dipping, spraying or the like. In the case of ultra-thin heat transfer laminates the substrates may be provided as identified in U.S. patent application Ser. No. 11/339,338, which is incorporated by reference in its entirety.

Figure 6:
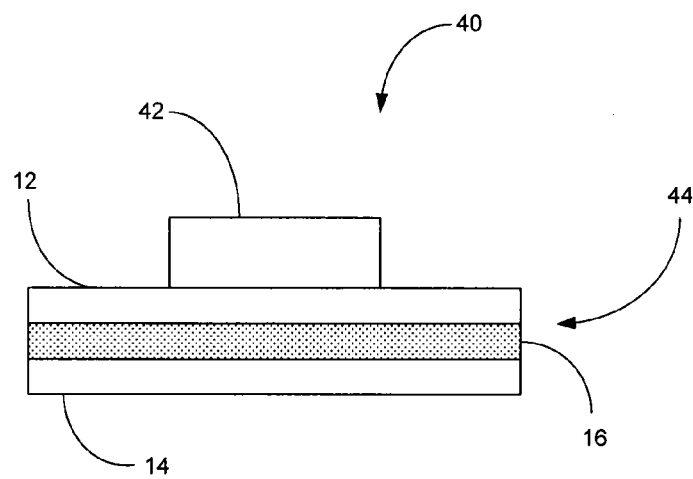
FIG. 6 is a schematic representation of an electronic assembly employing a thermal conductive composite in accordance with the present invention.

The composite materials and laminates may be employed as heat sink materials and used in an electronic apparatus. Referring to FIG. 6, an electronic structure 40 comprises an electronic device 42 in thermal contact with a heat sink 44 comprising a high thermal conductivity/low coefficient of thermal expansion composite material (having low CTE substrates 12 and 14 and thermally conductive layer 16). The heat sink may be provided in any form as desired for a particular purpose or intended use. In one aspect, for example, the heat skin may comprise a sheet of the high thermal conductivity/low coefficient of thermal expansion composite material. As described herein, the thermally conductive layer may have a layer of graphite material where the layered planes are oriented in the x-y or z direction relative to the plane of the metal substrates. In another aspect, the heat sink is formed by a base that comprises a high thermal conductivity/low coefficient of thermal expansion composite material and by a plurality of fins. The electronic device may be attached to the heat sink in any suitable manner as may be desirable or suitable for a particular purpose including for example, by epoxy, adhesive, solder, braze, or fasteners such as clamps, screws, bolts, and the like.

A heat sink design can be a complex task requiring extensive math-finite element analysis, fluid dynamics, etc. In designing heat sinks, various factors are taken into consideration, including thermal resistance, area of the heat sink, the shape of the heat sink, i.e., whether finned or pin design and the height of pins or fins, whether a fan or liquid pump is used and its air/liquid flow rate, heat sink material, and maximum temperature to be allowed at die.

Thermal resistance is the critical parameter of heat sink design. Thermal resistance is directly proportional to thickness of the material and inversely proportional to thermal conductivity of the material and surface area of heat flow. The invention relates to an advanced thermal management system with optimized thermal resistance, that may be used to provide a heat sink, or an ultra-thin heat sink comprising a conductive material such a graphite, with a CTE between 4 and 13 ppm/° C. and a thermal conductivity as high as 400 W/m-K or more.

EXAMPLES

The invention may be further described and understood in view of the following examples. The examples are provided for the purpose of illustrating aspects of the invention and are not intended to limit the invention disclosed herein in any manner with respect to any particular aspect such as the materials, process parameters, equipment, conditions, and the like.

Figure 8:
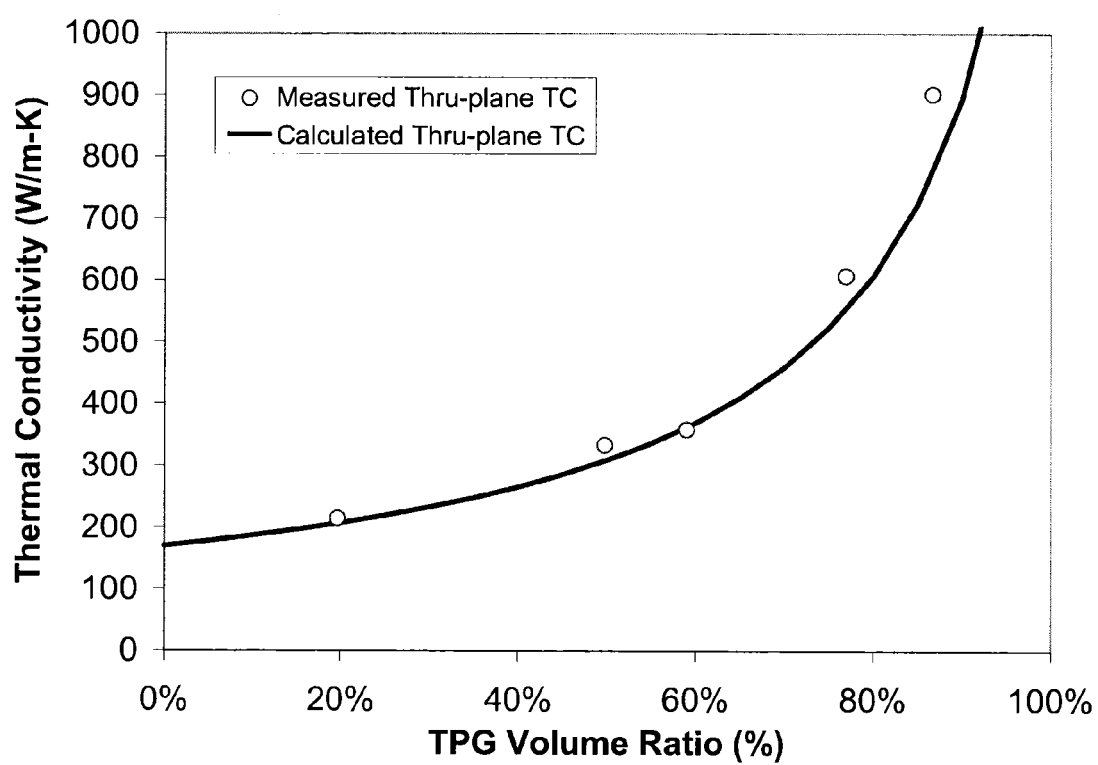
FIG. 8 is a graph illustrating the thermal conductivity of thermally conductive composites in accordance with aspects of the present invention at different graphite loadings.

Composites comprising metal substrates and a TPG board disposed there between are provided such that the layer planes of the TPG are oriented perpendicular to the planes of the metal substrates. The metal substrates are metal foils formed from a molybdenum-copper alloy comprising 70% molybdenum and 30% copper, and the composites are formed by laminating the substrates to the TPG board using a brazing method. Several laminates are provided having a graphite loading of 20%, 50%, 59%, 77% and 87% by volume. The actual and theoretical coefficient of thermal expansions is determined along with the actual and theoretically thermal conductivities of the composites (see FIGS. 7 and 8). As shown in FIG. 7, while the coefficient of thermal expansion in the x and y direction for such composites are expected to diverge from one another at higher graphite loadings, the composites were found to have excellent coefficient of thermal expansion in both directions even at the high TPG loadings. This is due to the exceptionally high modulus of elasticity of the molybdenum-copper substrate (240 GPa vs. TPG 11~30 GPa) that determines the dictation of the composite coefficient of thermal expansion by the stiff metal substrate. A similar study on TPG-copper composites revealed that the composite coefficient of thermal expansion starts to diverge around 50% volume loading, because of the relatively low modulus of copper (110 GPa). As shown in FIG. 8, the measured through-plane thermal conductivity with various TPG loading matches the calculated value, indicating a ultra-low thermal interface resistance is achieved with the use of brazing method.

Although aspects of a thermally conductive composite and an electronic device comprising such a composite have been shown and described with respect to certain embodiments, it is understood that equivalents and modifications may occur to others skilled in the art upon reading and understanding the specification. The present invention includes all such equivalents and modifications.

Having thus described the invention, we claim:

1. A thermally conductive composite comprising:
   a first metal substrate;
   a second metal substrate; and
   a layer of thermal pyrolytic graphite disposed between the first and second metal substrates, wherein the thermal pyrolytic graphite comprises a plurality of layered planes and the graphite is disposed in the composite such that the layered planes are oriented in a direction vertical to the plane of the first and second metal substrates; the first and second metal substrates bonded to the graphite layer and comprising a metal having a modulus of elasticity of about 200 GPa or greater, the composite having an in-plane coefficient of thermal expansion of about 13 ppm/° C. or less and a thermal conductivity of about 200 W/m-K or greater.

2. The thermally conductive composite of claim 1, wherein the first and second metal substrate independently comprises a metal chosen from tungsten, molybdenum, tungsten alloys, molybdenum alloys, or combinations of two or more thereof.

3. The thermally conductive composite of claim 1, wherein the first and second substrates independently comprise a metal chosen from a tungsten-copper alloy, a molybdenum-copper alloy, or a combination of two or more thereof.

4. The thermally conductive composite of claim 1, wherein the first and second metal substrate each have a coefficient of thermal expansion of about 4 to about 13 ppm/° C.

5. The thermally conductive composite of claim 1, comprising from about 20 to about 90% by volume of thermal pyrolytic graphite.

6. The thermally conductive composite of claim 1, comprising from about 40 to about 80% by volume of thermal pyrolytic graphite.

7. The thermally conductive composite of claim 1, comprising from about 55 to about 87% by volume of thermal pyrolytic graphite.

8. The thermally conductive composite of claim 1, wherein the substrates have a modulus of elasticity of about 300 GPa or greater.

9. The thermally conductive composite of claim 1, wherein the substrates have a modulus of elasticity of about 400 GPa or greater.

10. The thermally conductive composite of claim 1, wherein the composite has a coefficient of thermal expansion of about 4 to about 9 ppm/° C.

11. The thermally conductive composite of claim 1, wherein the composite has a coefficient of thermal expansion of about 4 to about 7 ppm/° C.

12. An electronic structure comprising:
    an electronic device; and
    a heat sink assembly in thermal contact with the electronic device, the heat sink assembly comprising a rigid thermally conductive composite comprising a piece of thermal pyrolytic graphite disposed between first and second metal substrates, wherein the thermal pyrolytic graphite comprises a plurality of layered planes and the graphite is disposed in the composite such that the layered planes are oriented in a direction vertical to the plane of the first and second metal substrates; the first and second metal substrates bonded to the graphite and comprising a metal independently having a modulus of elasticity of about 200 GPa or greater, and the composite having a coefficient of thermal expansion of about 13 ppm/° C. or less and a thermal conductivity of about 200 W/m-K or greater.

13. The electronic device of claim 12, wherein the first and second metal substrate independently comprises a metal chosen from tungsten, molybdenum, tungsten alloys, molybdenum alloys, or combinations of two or more thereof.

14. The electronic device of claim 12, wherein the first and second metal substrate each have a modulus of elasticity of about 300 GPa or greater.

15. The electronic device of claim 12, comprising from about 20 to about 90% by volume of thermal pyrolytic graphite.

16. The electronic device of claim 12, comprising from about 40 to about 80% by volume of thermal pyrolytic graphite.

17. A composite sheet comprising:
    a first metal substrate chosen from at least one of tungsten, molybdenum, tungsten-alloys, and molybdenum-alloys;
    a second metal substrate chosen from at least one of tungsten, molybdenum, tungsten-alloys, and molybdenum alloys; and
    a thermal pyrolytic graphite sheet disposed between the first and second metal substrates, the thermal pyrolytic graphite sheet comprising a plurality of layered planes and the graphite is disposed in the composite such that the layered planes are oriented in a direction vertical to the plane of the first and second metal substrates, the first and second metal substrates having a modulus of elasticity of about 200 GPa or greater, the composite sheet having a coefficient of thermal expansion of about 13 ppm/° C. or less and a thermal conductivity of about 200 W/m-K or greater.

18. The composite sheet of claim 17, comprising from about 20 to about 90% by volume of thermal pyrolytic graphite.

19. The composite sheet of claim 17, comprising from about 55 to about 87% by volume of thermal pyrolytic graphite.

20. The composite sheet of claim 17 having a thermal conductivity of about 300 to about 1000 W/m-K.

21. The composite sheet of claim 17, wherein the substrates are bonded to the graphite sheet.

\* \* \* \* \*